United States Patent
Strauss et al.

(10) Patent No.: US 9,032,244 B2
(45) Date of Patent: May 12, 2015

(54) MEMORY SEGMENT REMAPPING TO ADDRESS FRAGMENTATION

(71) Applicant: Microsoft Corporation, Redmond, WA (US)

(72) Inventors: Karin Strauss, Seattle, WA (US); Burton J. Smith, Seattle, WA (US); Kathryn S. McKinley, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 211 days.

(21) Appl. No.: 13/678,941

(22) Filed: Nov. 16, 2012

(65) Prior Publication Data

US 2014/0143593 A1 May 22, 2014

(51) Int. Cl.
| | |
|---|---|
| G06F 11/00 | (2006.01) |
| G06F 12/02 | (2006.01) |
| G11C 29/00 | (2006.01) |
| G11C 13/00 | (2006.01) |
| G11C 29/04 | (2006.01) |

(52) U.S. Cl.
CPC .......... *G06F 12/0246* (2013.01); *G11C 13/004* (2013.01); *G11C 29/808* (2013.01); *G11C 29/82* (2013.01); *G11C 2029/0409* (2013.01)

(58) Field of Classification Search
CPC  G06F 11/073; G06F 11/0796; G06F 12/0246
USPC ....................................................... 714/6.13
See application file for complete search history.

(56) References Cited

U.S. PATENT DOCUMENTS

| | | |
|---|---|---|
| 4,479,214 A | 10/1984 | Ryan |
| 4,547,882 A | 10/1985 | Tanner |
| 4,752,914 A | 6/1988 | Nakano et al. |
| 4,796,261 A | 1/1989 | Moriwaki |
| 5,058,059 A | 10/1991 | Matsuo et al. |
| 5,161,157 A | 11/1992 | Owen et al. |
| 5,233,614 A | 8/1993 | Singh |
| 5,535,328 A | 7/1996 | Harari et al. |
| 5,553,231 A | 9/1996 | Papenberg et al. |
| 5,553,263 A | 9/1996 | Kalish et al. |
| 5,588,112 A | 12/1996 | Dearth et al. |
| 5,598,553 A | 1/1997 | Richter et al. |
| 5,729,714 A | 3/1998 | Dei |
| 5,754,817 A | 5/1998 | Wells et al. |
| 5,864,569 A | 1/1999 | Roohparvar |

(Continued)

OTHER PUBLICATIONS

McNairy et al., "Montecito: A Dual-core, Dual-thread Itanium Processor", IEEE Computer Society, Mar. 2005, 11 pages.

(Continued)

*Primary Examiner* — Yolanda L Wilson
(74) *Attorney, Agent, or Firm* — Stephen A. Wright; Judy Yee; Micky Minhas

(57) ABSTRACT

The techniques discussed herein identify failed segments of memory in a memory region. The techniques may then manage the failed segments of memory by logically clustering the failed segments of memory at an outlying portion of the memory region using a remapping process. The remapping process may include creating and storing remapping metadata defining segment remapping entries for the memory region. Accordingly, the failure clustering logically eliminates or reduces the memory fragmentation so that a system can allocate larger portions of contiguous memory for object storage.

20 Claims, 5 Drawing Sheets

(56) References Cited

U.S. PATENT DOCUMENTS

| | | | |
|---|---|---|---|
| 5,882,784 A | 3/1999 | Sumiya et al. | |
| 5,883,842 A | 3/1999 | Miyauchi | |
| 6,000,006 A | 12/1999 | Bruce et al. | |
| 6,041,422 A | 3/2000 | Deas | |
| 6,112,286 A | 8/2000 | Schimmel et al. | |
| 6,115,828 A | 9/2000 | Tsutsumi et al. | |
| 6,263,452 B1 | 7/2001 | Jewett et al. | |
| 6,381,682 B2 | 4/2002 | Noel et al. | |
| 6,477,612 B1 | 11/2002 | Wang | |
| 6,560,725 B1 | 5/2003 | Longwell et al. | |
| 6,581,142 B1 | 6/2003 | Jacobs | |
| 6,754,784 B1 | 6/2004 | North et al. | |
| 7,107,411 B2 | 9/2006 | Burton et al. | |
| 7,221,604 B2 | 5/2007 | Cheng et al. | |
| 7,322,002 B2 | 1/2008 | Keays et al. | |
| 7,415,644 B2 | 8/2008 | Bower, III et al. | |
| 7,434,100 B2 | 10/2008 | Hogdal et al. | |
| 7,509,543 B2 | 3/2009 | Mohr et al. | |
| 7,511,646 B2 | 3/2009 | Cornwell et al. | |
| 7,543,177 B2 | 6/2009 | Bullen et al. | |
| 7,581,152 B2 | 8/2009 | Mukherjee et al. | |
| 7,594,062 B2 | 9/2009 | In et al. | |
| 7,603,593 B2 | 10/2009 | Iaculo et al. | |
| 7,610,523 B1 | 10/2009 | Singh | |
| 7,653,778 B2 | 1/2010 | Merry, Jr. et al. | |
| 7,681,109 B2 | 3/2010 | Litsyn et al. | |
| 7,706,198 B2 | 4/2010 | Jeong et al. | |
| 7,723,716 B2 | 5/2010 | Choi | |
| 7,917,689 B2 | 3/2011 | Rothman et al. | |
| 7,945,815 B2 | 5/2011 | Khatri et al. | |
| 8,050,093 B2 | 11/2011 | Hahn et al. | |
| 8,176,235 B2 | 5/2012 | Franceschini et al. | |
| 8,201,024 B2 | 6/2012 | Burger et al. | |
| 8,259,498 B2 | 9/2012 | Yogev et al. | |
| 8,407,410 B2 | 3/2013 | Abali et al. | |
| 8,484,522 B2 | 7/2013 | Flynn et al. | |
| 8,688,954 B2 | 4/2014 | Davis | |
| 2005/0193283 A1 | 9/2005 | Reinhardt et al. | |
| 2006/0106894 A1 | 5/2006 | Richardson | |
| 2006/0109725 A1* | 5/2006 | Yoon et al. | 365/200 |
| 2007/0022129 A1 | 1/2007 | Bahar et al. | |
| 2007/0061487 A1 | 3/2007 | Moore et al. | |
| 2007/0101094 A1 | 5/2007 | Thayer et al. | |
| 2007/0103977 A1* | 5/2007 | Conley et al. | 365/185.09 |
| 2007/0226450 A1 | 9/2007 | Engbersen et al. | |
| 2008/0010483 A1 | 1/2008 | Kuroishi et al. | |
| 2008/0052015 A1 | 2/2008 | Ozawa et al. | |
| 2008/0270675 A1* | 10/2008 | Nagaraj et al. | 711/100 |
| 2008/0275928 A1 | 11/2008 | Shuster | |
| 2009/0013148 A1 | 1/2009 | Eggleston | |
| 2009/0073739 A1 | 3/2009 | Bartley et al. | |
| 2009/0161430 A1* | 6/2009 | Allen et al. | 365/185.09 |
| 2009/0168569 A1 | 7/2009 | Ryu | |
| 2009/0276659 A1 | 11/2009 | Suzuki | |
| 2009/0287902 A1 | 11/2009 | Fullerton et al. | |
| 2009/0292944 A1* | 11/2009 | Gonzalez et al. | 714/5 |
| 2009/0300290 A1 | 12/2009 | Gollub et al. | |
| 2009/0323417 A1 | 12/2009 | Takada | |
| 2009/0327833 A1 | 12/2009 | Suto | |
| 2010/0037102 A1 | 2/2010 | Chen et al. | |
| 2010/0100715 A1 | 4/2010 | Gooding et al. | |
| 2010/0169602 A1 | 7/2010 | Hulbert et al. | |
| 2010/0218070 A1 | 8/2010 | Franceschini et al. | |
| 2010/0223447 A1 | 9/2010 | Serebrin | |
| 2010/0251013 A1 | 9/2010 | Yao et al. | |
| 2010/0269000 A1 | 10/2010 | Lee | |
| 2010/0281202 A1 | 11/2010 | Abali et al. | |
| 2010/0318845 A1 | 12/2010 | Kohiga | |
| 2011/0055623 A1 | 3/2011 | Kim et al. | |
| 2011/0060863 A1 | 3/2011 | Kimura et al. | |
| 2011/0119538 A1 | 5/2011 | Ipek et al. | |
| 2011/0145632 A1 | 6/2011 | Waldspurger et al. | |
| 2011/0191530 A1* | 8/2011 | Gonzalez et al. | 711/103 |
| 2011/0199845 A1 | 8/2011 | Yang et al. | |
| 2011/0202709 A1 | 8/2011 | Rychlik | |
| 2011/0209028 A1 | 8/2011 | Post et al. | |
| 2011/0231713 A1 | 9/2011 | Takada et al. | |
| 2011/0296258 A1 | 12/2011 | Schechter et al. | |
| 2012/0110278 A1 | 5/2012 | Davis et al. | |
| 2012/0124304 A1* | 5/2012 | Asnaashari et al. | 711/159 |
| 2012/0124442 A1 | 5/2012 | Strauss | |
| 2012/0239854 A1 | 9/2012 | Hsueh et al. | |
| 2013/0166829 A1* | 6/2013 | Dumitru et al. | 711/103 |

OTHER PUBLICATIONS

Micali, et al., "An 0(v|v|c|E|) Algorithm for Finding Maximum Matching in General Graphs", IEEE Computer Society, In the 21st Annual Symposium on Foundations of Computer Science, 1980, pp. 17-27.

Micheloni, et al., "Error Correction Codes for Non-Volatile Memories", Springer, Jun. 9, 2008, 77 pages.

"Micron, 512Mb DDR2 SDRAM Component Data Sheet: MT47H128M4B6-25", retrieved on May 25, 2010 at http://download.micron.com/pdf/datasheets/dram/ddr2/512MbDDR2.pdf, Micron Technology, Inc., 2004, pp. 1-129.

Mitzenmacher, "The Power of Two Choices in Randomized Load Balancing", retrieved on May 25, 2010 at http://www.eecs.harvard.edu/~michaelm/postscripts/mythesis.pdf, University of California, Berkeley, Doctoral Thesis, 1996, pp. 1-127.

Moinuddin K. Qureshi, "Pay-As-You-Go: Low-Overhead Hard-Error Correction for Phase Change Memories", In Proceedings of the 44th Annual IEEE/ACM International Symposium on Microarchitecture, Published Date: Dec. 6, 2011, 11 pages.

Mukherjee et al., "The Soft Error Problem: An Architectural Perspective", 11th International Symposium on High-Performance Computer Architecture, Feb. 12-16, 2005, 5 pages.

Narayanan et al., "Migrating Server Storage to SSDs: Analysis of Tradeoffs", EuroSys '09, Apr. 1-3, 2009, Nuremberg, Germany, 14 pages.

Novark et al., "Exterminator: Automatically Correcting Memory Errors with High Probability", PLDI'07, Jun. 11-13, 2007, San Diego, CA, 11 pages.

Office Action for U.S. Appl. No. 12/788,329, mailed Feb. 24, 2012, 22 pages.

Office Action for U.S. Appl. No. 12/780,931, mailed Jun. 24, 2011, 14 pages.

Office action for U.S. Appl. No. 12/621,396, mailed on Jul. 26, 2012, Ipek et al., "Improving Efficiency of Hardware Memory Access Using Dynamically Replicated Memory", 10 pages.

Orshansky et al., "Impact of Spatial Intrachip Gate Length Variability on the Performance of High-speed Digital Circuits", IEEE Transactions on Computer-Aided Design of Integrated Circuits and Systems, vol. 21, No. 5, May 2002, 10 pages.

PCM-Based MCP, obtained from www.micron.com/products/multichip-packages/pcm-based-mcp?source=mb, Retrieved Date: Aug. 27, 2012, 10 pages.

Pellizzer et al., "A 90nm Phase Change Memory Technology for Stand-alone Non-volatile Memory Applications", VLSI Technology, available from ieeexplore.ieee.org/stamp/stamp.jsp?tp=&arnumber=1705247&userType=inst, obtained on Mar. 19, 2012, 2 pages.

Ping Zhou et al., "A Durable and Energy Efficient Main Memory Using Phase Change Memory Technology", In Proceedings of the 36th Annual International Symposium on Computer Architecture, Published Date: Jun. 20, 2009, 10 pages.

Qureshi et al., "Enhancing Lifetime and Security of PCM-Based Main Memory with Start-Gap Wear Leveling", In Proceedings of the 42nd Annual IEEE/ACM International Symposium on Microarchitecture, Published Date: Dec. 12, 2009, 10 pages.

Qureshi et al., "Morphable Memory System: A Robust Architecture for Exploiting Multi-Level Phase Change Memories", In Proceedings of the 37th Annual International Symposium on Computer Architecture, Published Date: Jun. 19, 2010, 10 pages.

Qureshi et al., "Scalable High Performance Main Memory System Using Phase-Change Memory Technology", In Proceedings of the 36th Annual International Symposium on Computer Architecture, Published Date: Jun. 20, 2009, 10 pages.

(56) References Cited

OTHER PUBLICATIONS

Qureshi et al., "Scalable High Performance Main Memory System Using Phase-Change Memory Technology", ISCA '09, Jun. 20-24, 2009, Austin, Texas, 10 pages.
Ralph et al., "Spin Transfer Torques", In Journal of Magnetismand Magnetic Materials, vol. 320, Issue 7, Published Date: Apr. 2008, 5 pages.
Raoux et al., "Phase-change Random Access Memory: A Scalable Technology", In Journal of IBM Research and Development, vol. 52, Issue 4, Published Date: Jul. 2008, 15 pages.
Raoux, et al. "Phase-change random access memory: A scalable technology", retrieved on May 25, 2010 at http://www.signallake.com/innovation/raoux.pdf, IBM Journal of Research and Development, vol. 52, No. 4, 2008, pp. 465-479.
Sachindran et al., "Mark-Copy: Fast Copying GC with Less Space Overhead", In Proceedings of the 18th Annual ACM SIGPLAN Conference on Object-Oriented Programing, Systems, Languages, and Applications, Published Date: Oct. 26, 2003, 18 pages.
Sartor et al., "Z-Rays: Divide Arrays and Conquer Speed and Flexibility", In Proceedings of the 2010 ACM SIGPLAN Conference on Programming Language Design and Implementation, Published Date: Jun. 5, 2010, 12 pages.
Schechter et al., "Use ECP, not ECC, for Hard Failures in Resistive Memories", In Proceedings of the 37th Annual International Symposium on Computer Architecture, Published Date: Jun. 19, 2010, 12 pages.
Seong et al., "Safer: Stuck-At-Fault Error Recovery for Memories", In Proceedings of the 43rd Annual IEEE/ACM International Symposium on Microarchitecture, Published Date: Dec. 4, 2010, 10 pages.
Seong et al., "Security Refresh: Prevent Malicious Wear-out and Increase Durability for Phase-Change Memory with Dynamically Randomized Address Mapping", In Proceedings of the 37th Annual International Symposium on Computer Architecture, vol. 38 Issue 3, Published Date: Jun. 19, 2010, 12 pages.
"SESC: cycle accurate architectural simulator", retrieved on May 26, 2010 at http://sesc.sourceforge.net/, SESC Mailing List, 2005, pp. 1.
Singh et al., "A Software Based Online Memory Test for Highly Available Systems", In the proceeding of the 11th IEEE International on-line testing symposium, Published Date: Jul. 6, 2005, 2 pages.
Singh, et al., "A Software Based Online Memory Test for Highly Available Systems", Proceedings of the 11th IEEE International On-Line Testing D Symposium, Jul. 6-8, 2005, 2 pages.
Soundararajan, "Flexible Use of Memory for Replication/Migration in Cache-Coherent DSM Multiprocessors", retrieved on May 25, 2010 at ftp://db.stanford.edu/pub/cstr/reports/csl/tr/99/789/CSL-TR-99-789.pdf, Stanford University, Technical Report: CSL-TR-99-789, Nov. 1999, pp. 1-143.
Strukov et al., "The Missing Memristor Found", In Nature, vol. 453, Published Date: May 1, 2008, 4 pages.
Tiejun Gao, "Tolerating Failures in Wearable Memories", obtained from cecs.anu.edu.au/files/posters/2012/u4933469.pdf, Retrieved Date: Aug. 27, 2012, 1 page.
Wei Xu, "A Time-Aware Fault Tolerance Scheme to Improve Reliability of Multilevel Phase-Change Memory in the Presence of Significant Resistance Drift", IEEE Transactions on Very Large Scale Integration (VLSI) Systems, vol. 19, No. 8, Published Date: Aug. 2011, 11 pages.
Wicker et al., "Nonvolatile, High Density, High Performance Phase Change Memory", Aerospace Conference Proceedings, Mar. 18-25, 2000, 8 pages.
Wilkerson et al., "Trading off Cache Capacity for Reliability to Enable Low Voltage Operation", Proceedings of the 35th Annual International Symposium on Computer Architecture, Jun. 2008, 12 pages.
Wu, et al., "Hybrid Cache Architecture with Disparate Memory Technologies", retrieved on May 25, 2010 at http://dmclab.hanyang.ac.kr/wikidata/lectures12009_$_{FALL}$_SS/2_16.pdf, ACM, Proceedings of International Symposium on Computer Architecture (ISCA), Austin, TX, 2009, pp. 34-45.

Yang et al., "A Low Power Phase-Change Random Access Memory using a Data-Comparison Write Scheme", In IEEE International Symposium on Circuits and Systems, Published Date: May 27, 2007, 4 pages.
Yoon et al., "Free-p: Protecting Non-volatile Memory against Both hard and Soft Errors", In Proceedings of the 17th Symposium on High Performance Computer Architecture, Published Date: Feb. 12, 2011, 12 pages.
Zhang et al., "Characterizing and Mitigating the Impact of Process Variations on Phase Change based Memory Systems", In Proceedings of the 42nd Annual IEEE/ACM International Symposium on Microarchitecture, Published Date: Dec. 12, 2009, 12 pages.
Zhang et al., "Characterizing and Mitigating the Impact of Process Variations on Phase Change Memory Systems", Micro'09, Dec. 12-16, 2009, New York, 12 pages.
Zhang et al., "Exploring Phase Change Memory and 3D Die-Stacking for Power/Thermal Friendly, Fast and Durable Memory Architectures", In Proceedings of the 18th International Conference on Parallel Architectures and Compilation Techniques, Published Date: Sep. 12, 2009, 13 pages.
Zhou, et al., "A Durable and Energy Efficient Main Memory Using Phase Change Memory Technology", retrieved on May 25, 2010 at http://www.multicoreinfo.com/research/papers/2009/isca09-02-zhou-durable.pdf, ACM, Proceedings of International Symposium on Computer Architecture (ISCA), Austin, TX, 2009, pp. 1-10.
Zhou, et al., "Maximum matching on random graphs", retrieved on May 25, 2010 at http://arxiv.org/PS_cache/cond-mat/pdf/0309/0309348v1.pdf, EDP Sciences, Europhysics Letters, Sep. 15, 2003, pp. 1-7.
Kusnetsov et al., "Coding in a Memory with Defective Cells", Problems of Information Transmission, vol. 10, No. 2, 1974, pp. 132-138.
PCT Search Report & Written Opinion for Application No. PCT/US2013/070365, mailed Mar. 6, 2014, 8 pages.
Tsybakov, B.S. "Additive Group Codes for Defect Correction", Problems of Information Transmission, vol. 11, No. 1, 1975, pp. 111-113.
"A 90nm 1.8V 512Mb Diode-switch PRAM with 266 MB/s Read Throughput", available from catinist.fr/? aModele=afficheN&cpsidt=20222715, obtained on Mar. 19, 2010, 1 page.
"Emerging Research Devices", The International Technology Roadmap for Semiconductors, available from www.itrs.net/Links/2009ITRS/2009Chapters_2009Tables/2009_ERD.pdf, Retrieved Date: Jul. 3, 2012, 61 pages.
"Error Correction Code Pointer Control with Pointer Preprocessing", available from priorartdatabase.com/IPCOM/000117903, Published Date: Jul. 1996, 3 pages.
"Error Detecting and Error Correcting Codes", available from math.bu.edu/people/paul/242/fall99/eccodes.pdf, obtained on Oct. 17, 2012, 8 pages.
"Memory Error Detection and Correction: An Introduction to Parity and ECC", available from www.brouhaha.com/eric/computers/ecc.html, Published Date: Feb. 4, 1997, 3 pages.
"Samsung Introduces the Next Generation of Nonvolatile Memory—Pram", available from www.samsung.com/us/business/semiconductor/newsView.do?news_id=766, obtained on Mar. 19, 2010, 3 pages.
"The Basics of Phase Change Memory Technology", available from www.numonyx.com/Documents/WhitePapers/PCM_Basics_WP.pdf, obtained on Oct 18, 2012, 7 pages.
Ahn et al., "Highly Manufacturable High Density Phase Change Memory of 64Mb and Beyond", In IEEE International Electron Devices Meeting, Technical Digest, Published Date: Dec. 13, 2004, 4 pages.
Ahn et al., "Manufacturable High Density Phase Change Memory of 64Mb and Beyond", Electron Devices Meeting, Dec. 13-15, 2004, 4 pages.
Berger et al., "Hoard: A Scalable Memory Allocator for Multithreaded Applications", In ACM Conference on Architectural Support for Programming Languages and Operating Systems, Published Date: Nov. 2000, 12 pages.
Bhavnagarwala et al., "The Impact of Intrinsic Device Fluctuations on CMOS SRAM Cell Stability", IEEE Journal of Solid-State Circuits, vol. 36, No. 4, Apr. 2001, 8 pages.
Blackburn et al., "Immix: A Mark-Region Garbage Collector with Space Efficiency, Fast Collection, and Mutator Performance", In

(56) References Cited

OTHER PUBLICATIONS

Proceedings of the ACM SIGPLAN Conference on Programming Language Design and Implementation, Published Date: Jun. 7, 2008, 11 pages.

Blackburn et al., "Myths and Realities: The Performance Impact of Garbage Collection", In Proceedings of the Joint International Conference on Measurement and Modeling of Computer Systems, Published Date: Jun. 12, 2004, 12 pages.

Blackburn et al., "The DaCapo Benchmarks: Java Benchmarking Development and Analysis", In Proceedings of the 21st Annual ACM SIGPLAN Conference on Object-oriented Programming Systems, Languages, and Applications, Published Date: Oct. 22, 2006, 22 pages.

Borkar et al., "Parameter Variation and Impact on Circuits and Microarchitecture", Design Automation Conference, Jun. 2-6, 2003, 5 pages.

Burr et al., "Phase Change Memory Technology", In Journal of Vacuum Science & Technology B, vol. 28, Issue 2, Published Date: Mar. 29, 2010, 49 pages.

Cho et al., "Flip-N-Write: A Simple Deterministic Technique to Improve PRAM Write Performance, Energy and Endurance", In 42nd Annual IEEE/ACM International Symposium on Microarchitecture, Published Date: Dec. 12, 2009, 11 pages.

Christodoulopoulou, et al., "Dynamic Data Replication: an Approach to Providing Fault-Tolerant Shared Memory Clusters", retrieved on May 25, 2010 at http://www.eecg.toronto.edu/~azimi/publications/ftsvm2.pdf, Proceedings of Symposium on High Performance Computer Architecture (HPCA-9), Anaheim, CA, Feb. 2003, pp. 1-12.

Cohen et al., "Comparison of Compacting Algorithms for Garbage Collection", In ACM Transactions on Programming Languages and Systems, Published Date: Oct. 1983, 22 pages.

Condit, et al., "Better I/O Through Byte-Addressable, Persistent Memory", retrieved on May 25, 2010 at ftp://ftp.cs.utexas.edu/pub/dburger/papers/SOSP09.pdf, ACM, Proceedings of Symposium on Operating Systems Principles (SOSP), Big Sky, MT, Oct. 2009, pp. 133-146.

Datta et al., "Designing a Fast and Adaptive Error Correction Scheme for Increasing the Lifetime of Phase Change Memories", In the proceeding of 2011 29th IEEE VLSI Test Symposium, Published Date: May 1, 2011, 6 pages.

David Ungar, "Generation Scavenging: A Non-Disruptive High Performance Storage Reclamation Algorithm", In Proceedings of the First ACM SIGSOFT/SIGPLAN Software Engineering Symposium on Practical Software Development Environments, Published Date: Apr. 1984, 11 pages.

Demers et al., "Combining Generational and Conservative Garbage Collection: Framework and Implementations", In Proceedings of the 17th ACM SIGPLAN-SIGACT Symposium on Principles of Programming Languages, Published Date: Jan. 1990, 15 pages.

Dhiman et al., "PDRAM: A Hybrid PRAM and DRAM Main Memory System", Design Automation Conference, Jul. 26-31, 2009, 6 pages.

Doug Lea, "A Memory Allocator", obtained from g.oswego.edu/dl/html/malloc.html, Retrieved Date: Aug. 27, 2012, 8 pages.

Dyer, et al., "The Average Performance of the Greedy Matching Algorithm", retrieved on May 25, 2010 at http://citeseerx.ist.psu.edu/viewdoc/download;jsessionid=C308F0FAD0E81DF3570CDACC5DC3C8B9?doi=10.1.1.43.7442&rep=rep1&type=pdf, The Annals of Applied Probability, vol. 3, No. 2, 1993, pp. 526-552.

Edmonds, "Paths, Trees, and Flowers" (Review), retrieved on May 25, 2010 at http://nvl.nist.gov/pub/nistpubs/sp958-lide/140-144.pdf, Canadian Journal of Mathematics, vol. 17, 1965, pp. 449-467.

Ferreira et al., "Increasing PCM Main Memory Lifetime", available from http://www.cs.pitt.edu/~childers/papers/DATE10-07.7_1_0447.pdf, Oct. 2007, 6 pages.

Ferreira et al., "Using PCM in Next-generation Embedded Space Applications", In Proceedings of the 16th IEEE Real-Time and Embedded Technology and Applications Symposium, Published Date: Apr. 12, 2010, 10 pages.

Final Office Action for U.S. Appl. No. 12/788,329, mailed Jul. 13, 2012, 22 pages.

Final Office Action for U.S. Appl. No. 12/780,931, mailed Dec. 12, 2011, 13 pages.

Freitas et al., "Storage-class Memory: The Next Storage System Technology", IBM J. Res. & Dev., vol. 52, No. 4/5, Jul./Sep. 2008, 9 pages.

Gericota, et al., "Dynamic Replication: The Core of a Truly Non-Intrusive SRAM-based FPGA Structural Concurrent Test Methodology", retrieved on May 25, 2010 at http://citeseerx.ist.psu.edu/viewdoc/download?doi=10.1.1.5.5962&rep=rep1&type=pdf, IEEE Latin American Test Workshop, Montevideo, UY, Feb. 2002, pp. 70-75.

Greg Atwood, "The Evolution of Phase Change Memory", Micron Technology, Inc., Published Date: Jul. 26, 2010, 5 pages.

Hans-J. Boehm, "Conservative GC Algorithmic Overview", obtained from www.hpl.hp.com/personal/Hans_Boehm/gc/gcdescr.html, Retrieved Date: Aug. 27, 2012, 9 pages.

Horii et al., "A Novel Cell Technology using N-doped GeSbte Films for Phase Change RAM", VLSI Technology, Jun. 10-12, 2003, 2 pages.

Huang et al., "The Garbage Collection Advantage: Improving Program Locality", In Proceedings of the 19th Annual ACM SIGPLAN Conference on Object-oriented Programming, Systems, Languages, and Applications, Published Date: Oct. 24, 2004, 12 pages.

Hwang et al., "Full Integration and Reliability Evaluation of Phase-change RAM Based on 0.24 um-CMOS Technologies", In Symposium on VLSI Technology Digest of Technical Papers, Published Date: Jun. 10, 2003, 2 pages.

"International Technology Roadmap for Semiconductors", retrieved on May 26, 2010 at http://www.itrs.net/,ITRS, 2009, pp. 1-2.

Ipek et al., "Dynamically Replicated Memory: Building Reliable Systems from Nanoscale Resistive Memories", In Proceedings of the 15th International Conference on Architectural Support for Programming Languages and Operating Systems, Published Date: Mar. 13, 2010, 12 pages.

Ipek et al., "Self-optimizing Memory Controllers: A Reinforcement Learning Approach", Appears in Intl. Symp. on Computer Architecture (ISCA), Beijing, China, Jun. 2008, 12 pages.

Jeremy., "Linux: Memory Error Handling", Retrieved at http://kerneltrap.org/node/5293, Jun. 16, 2005, 16 pages.

Jie Chen et al., "RePRAM: Re-cycling PRAM Faulty Blocks for Extended Lifetime", In Proceedings of the 42nd Annual IEEE/IFIP International Conference on Dependable Systems and Networks, Published Date: Jun. 28, 2012, 12 pages.

John L. Henning, "SPEC CPU2006 Benchmark Descriptions", ACM SIGARCH Computer Architecture News, vol. 34, Issue 4, Published Date: Sep. 2006, 17 pages.

Kinam Kim, "Technology for Sub-50nm DRAM and NAND Flash Manufacturing", Electron Devices Meeting, Dec. 5, 2005, 4 pages.

Lee et al., "Architecting Phase Change Memory as a Scalable DRAM Alternative", In Proceedings of the 36th Annual International Symposium on Computer Architecture, Published Date: Jun. 20, 2009, 12 pages.

Luk et al., "Pin: Building Customized Program Analysis Tools with Dynamic Instrumentation", In Proceedings of the 2005 ACM SIGPLAN Conference on Programming Language Design and Implementation, Published Date: Jun. 12, 2005, 11 pages.

Jiang et al., "Enhancing Phase Change Memory Lifetime through Fine-Grained Current Regulation and Voltage Upscaling", In Proceedings of the 17th IEEE/ACM International Symposium on Low-Power Electronics and Design, 6 pages, Aug. 2011.

Magnusson et al., "Efficient Memory Simulation in SIMICS", Proceedings of the 28th Annual Simulation Symposium 1995, Apr. 1995, 12 pages.

May et al., "Alpha-Particle-induced Soft Errors in Dynamic Memories", IEEE Transactions on Electron Devices, vol. ED-26, No. 1, Jan. 1979, 8 pages.

* cited by examiner

MEMORY SEGMENT REMAPPING TO ADDRESS FRAGMENTATION

BACKGROUND

Due to scaling challenges, recent memory technologies may transition from using charge-based memories, such as dynamic random access memory (DRAM), to resistive and magneto-resistive memories, such as phase-change memory (PCM). However, many such memories tend to wear out.

Memory may wear when a system writes to the memory because a write may change the physical configuration of the material in the memory or degrade it in some other manner. Memories vulnerable to this issue are referred to as wearable memories. Due to the gradual degradation, wearable memories are subject to memory failures that can prevent the memory from reliably storing data for the system after a large amount of writes by the system. For example, a PCM cell can typically sustain $10^8$ writes before wearing out (i.e., failing), while a DRAM cell can typically sustain $10^{15}$ writes before failing.

Memory for a system may be divided into a plurality of regions, each region having multiple segments. A system may use the memory regions as a unit for memory allocation (e.g., during runtime) and/or transferring of data between a main memory and an auxiliary store, such as a hard disk drive. As individual segments in a memory region begin to fail due to a large number of writes, memory fragmentation occurs. Memory fragmentation arises when a memory region is divided into smaller portions of usable memory (e.g., one or more contiguous "working" segments) that are separated by a failed, or worn out, segment that is non-usable. Although the small portions of usable memory between the failed segments are still reliable for memory allocation, they are effectively unusable to a system because the small portions are individually too small to store larger objects (e.g., data) whose storage requires contiguous memory (e.g., multiple contiguous segments). In other words, the system cannot fit larger objects between two failed memory segments due to fragmentation.

SUMMARY

The techniques discussed herein extend the lifetime of wearable memories by addressing fragmentation. The techniques are implemented in a cooperative hardware and software system that identifies failed segments of memory in a memory region. The techniques may then manage the failed segments of memory by logically clustering the failed segments of memory at an outlying portion of the memory region using a remapping process. The remapping process may include creating and storing remapping metadata defining segment remapping entries for the memory region. Accordingly, the failure clustering logically eliminates or reduces the memory fragmentation so that a system can allocate larger portions of contiguous memory for object storage.

In at least one embodiment, system software (e.g., an operating system) and/or a memory controller may then access, use, and update the remapping metadata during memory allocation, memory reads, memory writes, or a combination thereof. For example, the system software and/or the memory controller may allocate memory during runtime execution by communicating memory failures and indicating an amount of contiguous storage space within a memory region after the memory failures have been remapped and clustered.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter. The term "techniques," for instance, may refer to system(s), hardware, method(s), computer-readable instructions, module(s), and/or algorithms as permitted by the context above and throughout the document.

BRIEF DESCRIPTION OF THE CONTENTS

The detailed description is presented with reference to accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
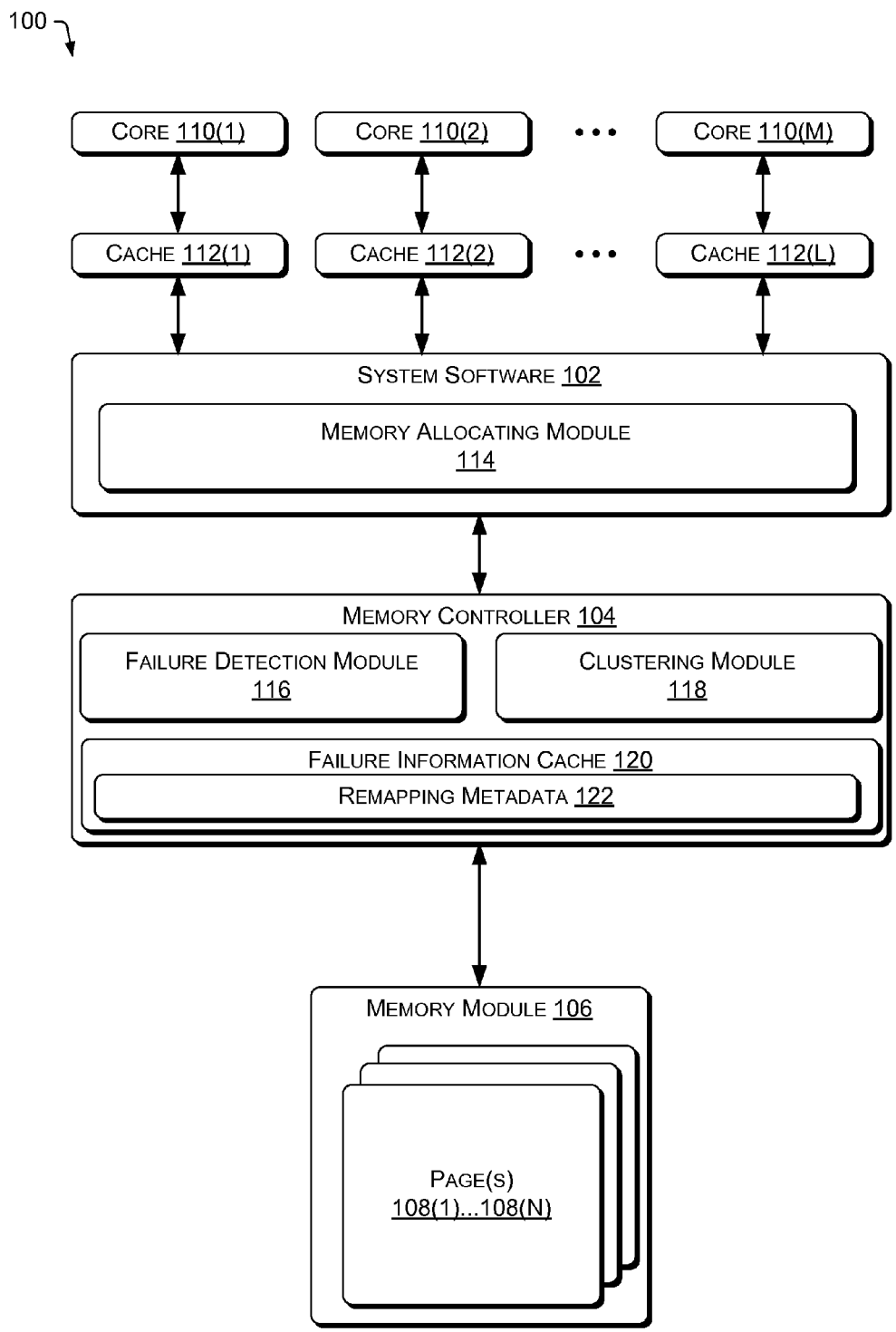
FIG. 1 illustrates an example system architecture for implementing the clustering and remapping techniques, in accordance with various embodiments described herein.

The following description sets forth techniques that logically reduce and/or eliminate fragmentation within a memory region resulting from failed segments. When a system detects a failure of a segment within the memory region, the techniques logically remap the failure to an outlying portion of the memory region (e.g., the top or bottom of the memory region). The techniques may also create remapping metadata indicating segment location switches and segment offsets so that the system can allocate larger portions of contiguous memory that result from remapping the failed segments to the outlying portion of the memory region. In at least one embodiment, the remapping metadata is unique to the memory region and the techniques store the remapping metadata within the memory region. A system may then use the remapping metadata during a memory allocation process.

As discussed above, wearable memories are subject to memory failures that can prevent the memory from reliably storing data after a large amount of writes. The memory failures may be pre-existing failures or static failures, or the memory failures may be dynamic failures. In various embodiments, the memory is main memory that may include a large portion of wearable memory (which is typically expected to be denser and more cost-effective memory) and a smaller portion of DRAM that stores data and operations that cannot be allowed to fail (e.g., operations that may be essential to an operating system). Wearable memories may provide stable storage segments that fail in finer granularities compared to larger regions of main memory. In the context of this document, the larger memory regions are described as memory pages and the segments of the memory pages are referred to as lines. However, it is understood in the context of this document, that the memory regions may be any unit or block of memory used for memory allocation in wearable memory or other memory technologies. Moreover, the memory regions and the lines may vary in size or capacity for object storage (e.g., the regions and/or lines may be more granular or less granular).

When a memory failure occurs in a system that uses DRAM as main memory, an entire memory region (e.g., page) is disabled. However, a permanent memory failure using DRAM is very rare. In contrast, permanent memory failures in wearable memories are more common. If the same or similar disablement of an entire memory region were employed for wearable memories, memory capacity would be exhausted quickly, even though each memory region still has all but one functional segment. For this reason, instead of disabling memory at a region granularity, systems employing wearable memories may disable memory at finer segment granularities (e.g., a line granularity). However, because memory translation from virtual addresses to physical addresses can still be done at the region granularity in systems with wearable memory (and it is usually done at the region granularities due to performance overhead reasons), this may lead to a virtual address space that cannot be made fully contiguous, resulting in fragmentation.

Thus, the techniques discussed herein address the aforementioned memory fragmentation problems by clustering failed memory lines at an outlying portion of individual memory pages (e.g., the top or the bottom of the memory page). In order to cluster the failed memory lines, the techniques implement a remapping process within each memory page. Consequently, the techniques logically create larger portions of contiguous memory so that objects larger than the working memory between any two failed segments can still be stored in the page when segment failures begin to occur. This extends the life of the memory region.

In some embodiments, the techniques may cluster failed memory lines at an outlying portion of a larger memory remapping region. For example, the techniques may be configured to place the failed memory lines at the top or bottom of every second, fourth, eighth, etc., memory pages instead of each individual memory page. Therefore, the techniques may be configured to implement the remapping and clustering processes on a "remapping" memory region that is a multiple of the hardware memory module region size (e.g., two memory pages, four memory pages, eight memory pages, and so forth). This may further eliminate fragmentation and create larger portions of contiguous storage blocks.

In various embodiments, the failure clustering and remapping process described herein can be implemented after a system uses and exhausts other memory error correction resources. For example, other memory error correction resources may include standard error correction techniques like error-correcting code ECC (typically used for DRAM today) and error correcting pointer entries.

Illustrative Architecture

FIG. 1 depicts an example system architecture 100 for implementing the techniques discussed herein. The system architecture 100 may be configured as any suitable computing device that uses memory technologies that are susceptible to fragmentation. By way of example and not limitation, the system architecture 100 may include personal computing devices, laptop computing devices, smart phones, server computing devices, server farms, datacenters, or any other devices that use and/or allocate memory. Accordingly, the system architecture 100 may include system software 102, a memory controller 104, and a memory module 106. The system software 102, the memory controller 104, and/or the memory module 106 may be connected and may communicate in a variety of different configurations (e.g., a system bus, network, etc.).

In various embodiments, the system software 102 may include an operating system, such as a Microsoft Windows® operating system, a smart phone operating system, a real-time operating system, or any other type of operating system coupled to a memory module 106. Moreover, the system software 102 may include any type of runtime executable environments (e.g., virtual machines, managed code, etc.). In at least one embodiment, an operating system may communicate memory failures to the runtime executable environments so that the runtime executable environments can allocate memory around the memory failures.

In various embodiments, the system software 102 and/or the memory controller 104 are configured to manage the flow of data to and from the memory module 106 (e.g., physical memory). The memory module 106 may be a hardware memory module that includes a plurality of pages 108(1) . . . 108(N), where each page 108(1) . . . 108(N) may represent a larger region of memory discussed above. To this end, the system software 102 and/or the memory controller 104 may be configured to allocate memory space in the pages 108(1) . . . 108(N) for objects associated with programs or applications executing on one or more processing cores 110(1) . . . 110(M) that are being managed by the system software 102. Therefore, the system software 102 may be configured to provide services to the one or more processing cores 110(1) . . . 110(M), and each processing core 110(1) . . . 110(M) may have a cache 112(1) . . . 112(L) that caches one or more of the pages 108(1) . . . 108(N) currently being accessed by the system software 102 and/or the memory controller 104. Moreover, caches 112(1) . . . 112(L) may also cache memory failure or error information communicated by the system software 102. In at least one embodiment, caches 112(1) . . . 112(L) may be Static Random Access Memory (SRAM).

In various embodiments, the memory module 106 is main memory for the system architecture 100 and the system software 102. The system software 102 may be stored in the memory module 106 or may be stored in a separate memory within the system architecture 100 other than the memory module 106. The memory controller 104 may be part of computer hardware that is located on a printed circuit board with the memory module 106, the memory controller 104 may be located on the same substrate with the memory module 106, or the memory controller 104 may be located on a chip substrate with the processing cores 110(1) . . . 110(M). In at least one embodiment, the memory controller 104 is embedded in firmware or in a field programmable gate array (FPGA). In another embodiment, the memory controller 104 may be an application specific integrated circuit (ASIC) associated with the memory module 106, or a device driver associated with the memory module 106. Thus, the memory controller 104 may be located on a processing side of the system architecture 100, or the memory controller 104 may be located locally on the memory module 106.

As discussed above, pages 108(1) . . . 108(N) each include multiple lines that the system software 102 and/or the memory controller 104 may use for memory allocation. A size of a memory page and a number of memory pages in the memory module may vary in accordance with system architecture. For example, the size of a memory page may fall within a range of approximately one kilobyte up to two megabytes. Moreover, in at least one example, each line in a memory page may be 512 bits. However, in other examples, pages and lines may be smaller or larger.

In various embodiments, each of the processing cores 110(1) . . . 110(M) may include one or more processors. The processors may be a single processing unit or a number of two or more units, any or all of which could include multiple computing units. The processors may be implemented as one or more microprocessors, microcomputers, microcontrollers, digital signal processors, central processing units, state machines, logic circuitries, shared-memory processors, and/or any devices that manipulate signals based on operational instructions. Among other capabilities, the processors may be configured to fetch and execute computer-readable instructions stored in the system software 102, the memory controller 104, or any other application or program accessible to the system architecture 100.

As further discussed herein, the pages of memory 108(1) . . . 108(N) in the memory module 106 may be pages of wearable memory, such as PCM. However, the techniques described herein are broadly applicable to systems employing other types of hardware memory technologies, including but not limited to, flash memory, RAM subsystems, Spin-Torque Transfer Magnetoresistive RAM (STT-MRAM), Ferroelectric RAM (FRAM), Resistive RAM (RRAM), or any other magneto-resistive memories. Moreover, the techniques discussed herein may also be applicable to charge-based memories such as DRAM.

In various embodiments, the system software 102 may include a memory allocating module 114, and the memory controller 104 may include a failure detection module 116, a clustering module 118, and a failure information cache 120. The memory allocating module 114 may be configured to manage the flow of data (e.g., objects) going to and from the pages 108(1) . . . 108(N) in the memory module 106. The failure detection module 116 may be configured to detect failed lines within each of the pages 108(1) . . . 108(N). For example, the failure detection module 116 detects and confirms that a line has failed and is no longer reliable when the memory controller 104 writes data to a line in a page 108(N) currently being accessed while also temporarily storing another version of the data in a buffer. Then the memory controller 104 reads the data back (e.g., immediately reads the data back) from the page 108(N) currently being accessed and the failure detection module 116 compares the read data to the other version of the data temporarily stored in the buffer. If the data read back from the page 108(N) currently being accessed is not the same as the data temporarily stored in the buffer, then the failure detection module 116 identifies the line within the page 108(N) currently being accessed as a failed line.

In various embodiments, the failure detection module 116 may be configured to store region failure information in the failure information cache 120. The region failure information includes whether or not each of the individual pages 108(1) . . . 108(N) has a permanent line failure. If a page 108(N) has a permanent line failure, the memory controller 104 may cache remapping metadata 122 for the page 108(N) in the failure information cache 120, as well as an address for the page 108(N). Accordingly, the memory allocating module 114 may use the remapping metadata 122 stored in the failure information cache 120 to manage read and/or write requests to pages 108(1) . . . 108(N) that have at least one permanent line failure.

As further discussed herein, in various embodiments, the clustering module 118 is configured to create the remapping metadata 122 that remaps failed lines to the edges of each of the individual pages 108(1) . . . 108(N) (e.g., the top of the page or the bottom of the page) or to the edges of a page 108(1) . . . 108(N) that is at the end of a larger memory remapping region (e.g., four pages or eight pages). In some embodiments, the clustering module 118 may create the remapping metadata 122 for an individual page 108(N) or a larger memory remapping region when the failure detection module 116 first identifies a permanent line failure (i.e., a failed line) within the individual page 108(N).

In various embodiments, when a page 108(N) is currently being used, is expected to be used, or has recently been used by the system software 102 in conjunction with one or more of the processing cores 110(1) . . . 110(M), the memory allocating module 114 may temporarily store the remapping metadata 122 for the current page 108(N) in the failure information cache 120, as further discussed herein. In alternative embodiments, the remapping metadata 122 will also be stored in one or more of the caches 112(1) . . . 112(L).

While the failure detection module 116 and the clustering module 118 are depicted on the memory controller 104, it is understood in the context of this document that some or all the functionality performed by these individual modules may additionally or alternatively be stored elsewhere or be located on, or spread across, the system software 102 (e.g., some functionality may be performed by the operating system). Moreover, in various embodiments the system software 102 may also maintain a separate failure map cache that stores information on memory failures and passes this information to runtime executable environments at memory allocating points so that the memory failures can be avoided. Consequently, in at least some embodiments, the system software 102 and the memory controller 104 may communicate with each other and exchange information to perform the techniques discussed herein.

Figure 2:
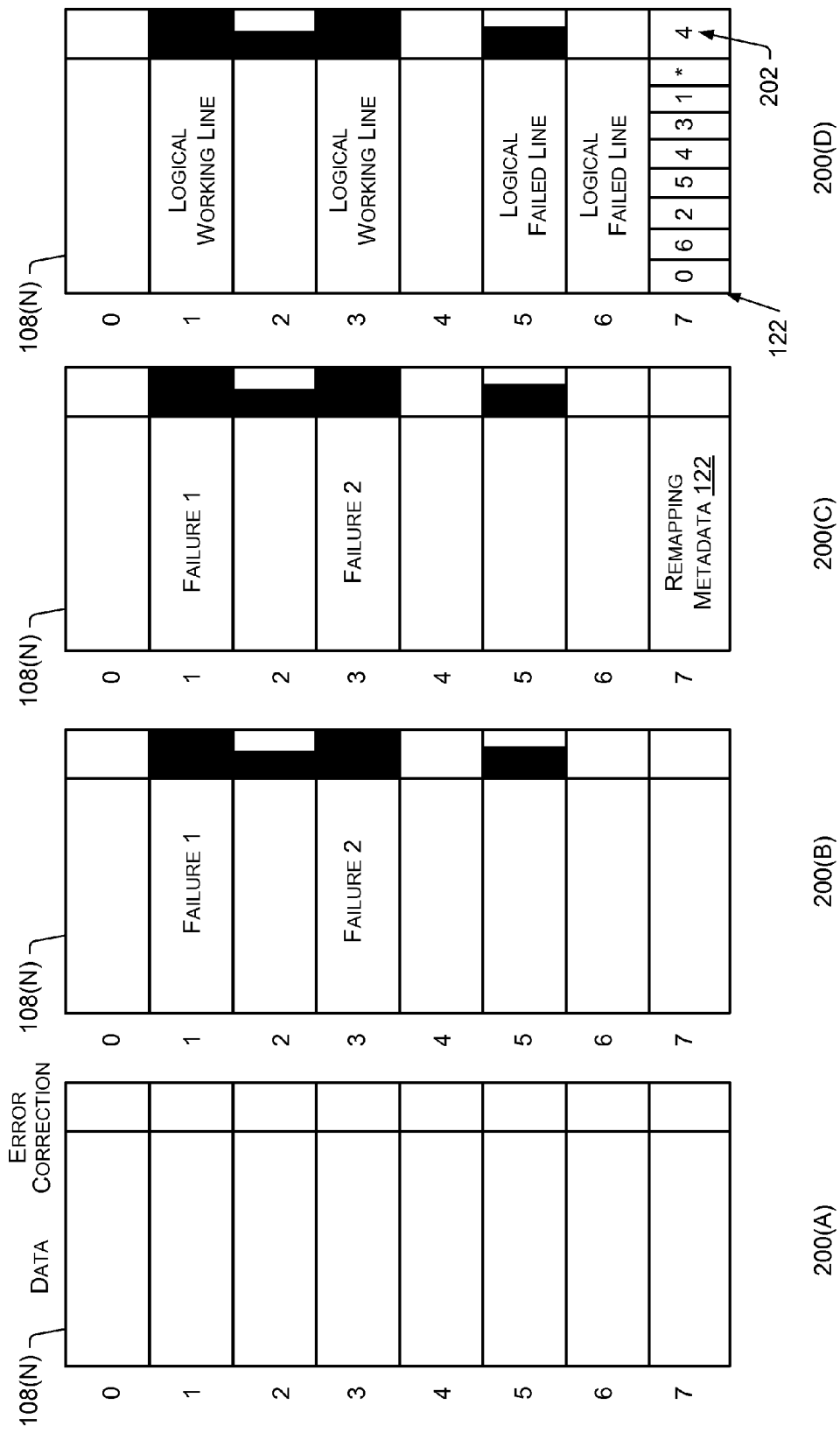
FIG. 2 illustrates an example region of memory at different stages as the example system architecture implements the clustering and remapping techniques, in accordance with various embodiments described herein.

FIG. 2 illustrates different stages for an individual memory page 108(N) as the memory page wears out and the operating system 102 and/or the memory controller 104 implement an example remapping process over time. As discussed above, the individual memory page 108(N) may include multiple different lines. The storage capacity of each line and a number of lines in each page may depend on the type of memory used. In at least one embodiment, a line may be 512 bits and a page 108(N) may be a four kilobyte page.

However, as depicted in FIG. 2, the page 108(N) includes eight lines, indexed 0, 1, 2, 3, 4, 5, 6, and 7, for illustrative purposes and ease of understanding. While the lines in FIG. 2 are consecutively indexed using numerical values 0 through 7, it is understood in the context of this document that any line or segment addressing scheme for larger memory regions may be used. Moreover, as illustrated in FIG. 2, each line may be split up into a data storing portion and an error correction portion. The data storing portion stores the objects or parts of the objects allocated to the memory module 106, and the error correction portion is reserved for available error correction for each individual line. When the error correction is completely exhausted (e.g., the error correction portion is completely filled in FIG. 2), the failure detection module 116 identifies the line as a failed line, as discussed above. In alternative embodiments, the individual lines may not include the error correction portion.

As illustrated at stage 200(A), the page 108(N) is a perfect page as it does not yet include any failed lines and each line has a complete set of error correction resources available. However, as the system software 102 and/or the memory controller 104 begin to write to the page 108(N) during memory allocation processes conducted over time, and due to variation within individual cells that constitute the wearable memory, individual lines within the page 108(N) may wear at different levels.

As illustrated at stage 200(B), line 1 and line 3, labeled "Failure 1" and "Failure 2" respectively, have each exhausted all the available error correction resources. Thus, the failure detection module 116 may detect that these lines have failed, and for the purpose of this discussion, assume line 1 fails first and line 3 fails second, after line 1 has failed.

In various embodiments, when the failure detection module 116 detects that a first line (e.g., line 1) within an individual memory page 108(N) has failed, the clustering module 118, at stage 200(C), creates the remapping metadata 122 and allocates a line of memory (e.g., line 7) within the page 108(N) for the remapping metadata 122. Thus, when a first line of the page 108(N) fails due to being worn out (e.g., line 1), the clustering module 118 may also create a second, "fake" failure at the same time. The second, fake failure line that stores the remapping metadata 122 may be located at an outlying portion of the page 108(N) (e.g., line 7). The clustering module 118 installs the remapping metadata 122 at the top or the bottom of the page 108(N) so that it does not interrupt contiguous storage space.

In various embodiments, the remapping metadata 122 includes a number of entries that reflects the number of lines in the page 108(N). For example, the remapping metadata 122 has an entry 0 corresponding to line 0, an entry 1 corresponding to line 1, an entry 2 corresponding to line 2, and so forth. The remapping metadata 122 is configured to logically re-organize the lines within the page 108(N) by switching or offsetting the entries so that the reliable or working lines create logical contiguous space within the page 108(N) and the unreliable or failed lines are logically redirected to an outlying portion of the page 108(N) where the remapping metadata 122 has also been installed. The amount of storage space required for each entry in the remapping metadata 122 may be a number of bits based on the logarithm of the number of lines in the page 108(N). Because the remapping metadata 122 manages and redirects the storage space for the page 108(N), the remapping metadata 122 may be redundantly stored in case some of the bits where the remapping metadata 122 is stored fail or are corrupted. Moreover, the clustering module 118 may be configured to regenerate the remapping metadata 122 if the remapping metadata 122 is corrupted by testing the hardware with writes.

As illustrated at stage 200(D), the clustering module 118 switches the entry for line 1 (e.g., the actual failure at stage 200(C)) with the entry for line 6 at the bottom of the page. Thus, according to the remapping metadata 122 with the switched entries, line 6 becomes a logical failed line and line 1 becomes a logical working line. The memory controller 104 stores the data in actual line 6, which has logically been switched to line 1 to create contiguous storage space.

Moving on, when actual line 3 fails, the clustering module 118 switches the entry for failed line 3 with the entry for working line 5 which is the next working line available to be switched during the remapping process. Again, by switching the entries, the clustering module 118 creates a logical portion of contiguous memory space that is not interrupted or divided by failed memory lines.

In various embodiments, each entry in the remapping metadata 122 may be indexed to reflect the physical address offset (e.g., the physical location of the original line associated with the entry) and a logical line offset (e.g., the physical location of the remapped line when the original line fails). Thus, in various embodiments, the remapping metadata 122 produces an address or location translation by indicating that failed line 1 has logically been switched with working line 6, and failed line 3 has logically been switched with working line 5, as illustrated in the re-organization (e.g., re-ordering) of the remapping metadata 122 entries at stage 200(D). Since the remapping metadata 122 has been created for and installed in line 7, the entry for line 7 may be null (e.g., "*") and not include any redirecting entry. In various embodiments, the entry for line 7 may store redundant remapping metadata, as mentioned above.

Consequently, initial entries in the remapping metadata 122 corresponding to working lines in the page 108(N) that have not been logically switched with failed lines remain the same. For example, at stage 200(D), the entries for lines 0, 2 and 4 in the remapping metadata 122 have not been modified or changed because they have not been swapped with entries for a failed line.

In various embodiments, the remapping metadata 122 uses a boundary pointer 202 so that the clustering module 118 can identify the next available working line to logically swap with a failed line. Since the clustering module 118 logically clusters the failed lines together at the outlying portion of the page 108(N), the boundary pointer 202 points to the next working line that separates the logical contiguous space from the logical failed space. For example, at stage 200(D), the boundary pointer 202 points to actual line 4, as the next working line that borders and separates the logical failures (e.g., lines 5, 6, and 7) clustered at the bottom of the page 108(N). Accordingly, when the failure detection module 116 detects another line failure, the clustering module 118 re-organizes the memory page 108(N) by logically redirecting, in the remapping metadata 122, the address or index of the failed line to the line identified by the boundary pointer 202. The clustering module 118 may then advance the boundary pointer 202 to the next working line and update the remapping metadata 122.

In various embodiments, each line in the page 108(N) is configured with an indicator that allows the memory allocating module 114 to identify, during an initial access, whether the line has logically been remapped via the clustering process. For example, the indicator may be a single bit reserved in the error correction portion indicating that "yes", the line has failed and has been remapped, or "no" the line has not failed and the data being accesses is stored in the line. When a line has failed, the clustering module 118 may set this indicator to indicate that the line has been redirected or remapped. In at least one embodiment, the memory allocating module 114 and/or the memory controller 104 can locate the remapping metadata 122 because the memory allocating module 114 and/or the memory controller 104 are aware that the remapping metadata 122 may be located at the first line at the top of page 108(N) or the last line at the bottom of the page 108(N). In other embodiments, the indicator for each line may be further configured to have additional capacity to point to the remapping metadata 122 within the page 108(N).

As seen in the differences between stage 200(B) and stage 200(D), the clustering and remapping processes discussed herein logically create a larger amount of contiguous space for larger object allocation. For example, if the memory allocating module 114 had to allocate memory around failed lines 1 and 3 at stage 200(B), the memory allocating module 114 could store data at i) line 0, ii) line 2, or iii) lines 4-7 (e.g., four contiguous lines). After implementing the clustering and remapping processes, the memory allocating module 114 is able to store data in logically working lines 0-4 (e.g., five contiguous lines). As mentioned above, the page 108(N) in FIG. 2 includes eight lines for illustrative purposes and ease of understanding. Accordingly, the benefits and advantages of the clustering and remapping processes may be more apparent using examples where there are more lines (e.g., 64 lines in a page), more failed lines dispersed within the page, etc.

Figure 3:
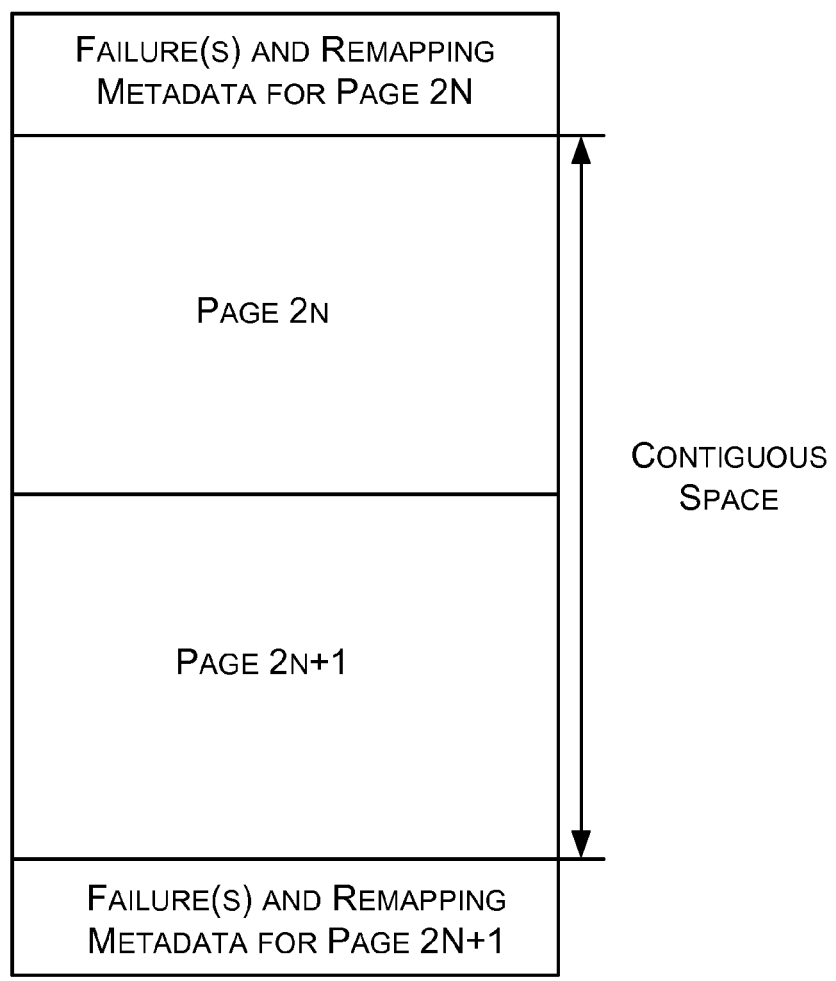
FIG. 3 illustrates two consecutive example regions of memory, in accordance with various embodiments described herein.

FIG. 3 illustrates two contiguous pages 2N and 2N+1 300 stored in the memory module 106. To further maximize the amount of contiguous memory space, the clustering module 118 may be configured to cluster failed lines and the remapping metadata 122 at the top of even pages (e.g., pages 2N) in the memory module 106 and at the bottom of odd pages (e.g., pages 2N+1) in the memory module 106, or vice versa. Thus, the amount of contiguous memory space may span two consecutive pages—the bottom of page 2N and the top of page 2N+1, as illustrated in FIG. 3.

In various embodiments, the clustering module 118 may increment or decrement the boundary pointer 204 and organize the entries in the remapping metadata 122 for each page 108(N) depending on whether the clustering occurs at the top of the page (e.g., remapping metadata 122 stored in line 0) or the bottom of the page (e.g., remapping metadata 122 stored in the last line of the page, i.e. line 7 in the example of FIG. 2).

The examples provided above with respect to FIGS. 2 and 3 describe the memory remapping regions as individual pages which correspond to the memory system regions (e.g., pages 108(1) . . . 108(N)). However, other implementations of the memory remapping and clustering processes may not use memory remapping regions that have the same granularity as the memory system regions. For example, the clustering module 118 may implement a memory remapping region that is a multiple of the memory regions used in the hardware memory module 106. Thus, the clustering module 118 may place the remapping metadata 122 at the top or bottom of every second, fourth, eighth page, for example. Moreover, the remapping metadata 122 and the boundary pointer 102 may be configured to reference a particular page as well as a line that has been switched. This may further eliminate fragmentation and create larger portions of contiguous memory.

In at least one embodiment, the clustering module 118 may be configured to transition from one memory remapping region size (e.g., one page) to another memory remapping region size (e.g., eight pages). For example, the clustering module 118 may initially cluster failed lines in accordance with an individual page granularity, but after each of a group of pages experience failed lines, the clustering module 18 may instead cluster failed lines in accordance with an eight page granularity (e.g., eight page memory remapping region) to eliminate more fragmentation. Here, the system software 102 and the memory controller 104 may then reconfigure the system accordingly and update the remapping metadata 122 to reflect the transition from one memory remapping region size to another memory remapping region size.

Illustrative Processes

Figure 4:
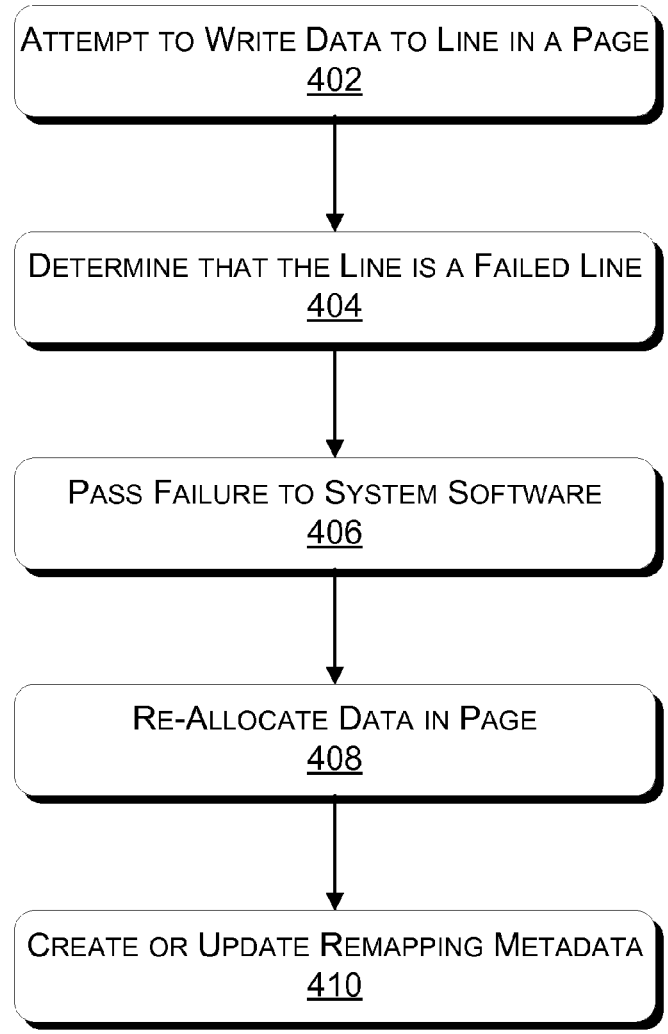
FIG. 4 illustrates an example memory allocation process that creates and/or updates remapping metadata, in accordance with various embodiments described herein.
Figure 5:
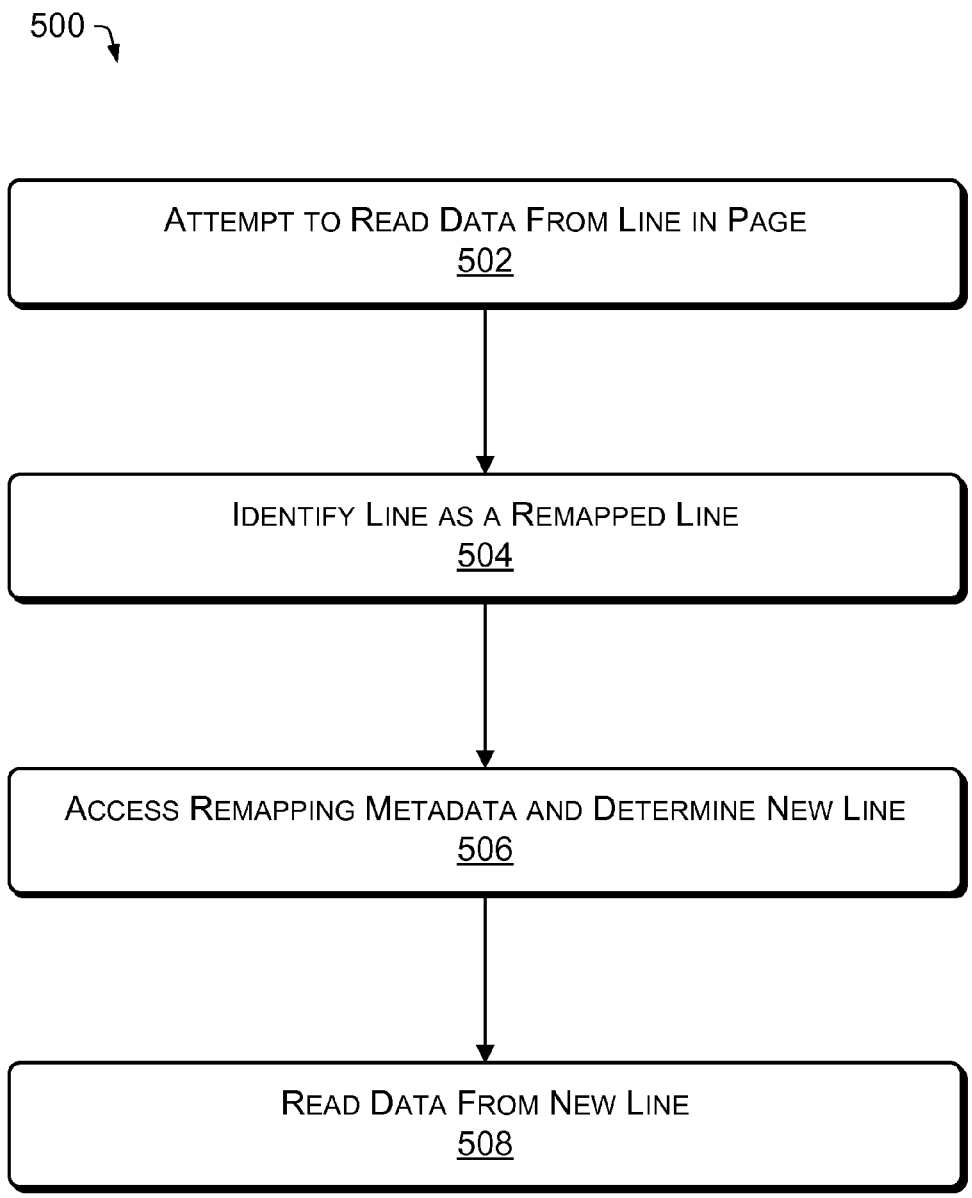
FIG. 5 illustrates an example memory allocation process that uses the remapping metadata to read data from a memory region, in accordance with various embodiments described herein.

Example operations are described herein with reference to FIGS. 4 and 5. The processes are illustrated as logical flow graphs, which represent a sequence of operations that can be implemented in hardware, software, or a combination thereof. In the context of software, the operations represent computer-executable instructions that, when executed by one or more processors, perform the recited operations. Generally, computer-executable instructions include routines, programs, objects, components, modules, data structures, and the like that perform particular functions or implement particular abstract data types. The order in which the operations are described is not intended to be construed as a limitation, and any number of the described operations can be combined in any order and/or in parallel to implement the process.

FIG. 4 illustrates an example process 400 directed to creating and/or updating the remapping metadata 122 for an individual page 108(N) in the memory module 106. For instance, the example process 400 may be associated with a write operation performed by the memory allocating module 114 located on the system software 102, the memory controller 104, or a combination thereof. Moreover, the memory controller 104 may be located on the memory module 106 or separate from the memory module 106 on the processing side of the system along with the system software 102.

At operation 402, the memory controller 104 receives an issued instruction to write and the memory controller 104 attempts to write data to a line in a page 108(N). For example, the memory controller 104 may receive an issued instruction when the cache hierarchy wants to evict a dirty line and therefore requests a writeback. The memory controller 104 may then be configured to identify a page 108(N) and a line for the writeback.

At operation 404, the failure detection module 116 detects that the line is a failed line. For example, the failure detection module 116 detects and confirms that the line is a failed line and is no longer reliable for storage purposes when the memory controller 104 actually writes data to the line and also temporarily stores another version of the data in a buffer. When the memory controller 104 reads the data back from the line, the failure detection module 116 compares the read data to the other version of the data temporarily stored in the buffer. If the data read back from the line is not the same as the data temporarily stored in the buffer, then the failure detection module 116 determines that the line is a failed line.

At operation 406, the memory controller 104 may pass the line failure and unwritable data to the system software 102. For example, the memory controller 104 may use a failed write buffer and a generated interrupt to convey the failure information to an operating system. The memory controller 104 passes this information because failed lines in the page 108(N) may contain one or more objects that are in use by a managed runtime or other system component.

At operation 408, the memory allocating module 114 of the system software 102 may then re-allocate or move, e.g., for a managed runtime, the one or more objects in the page 108(N) to different memory locations in the memory module 106 (e.g., other pages). This re-allocation frees the entire page 108(N). In various embodiments, the memory allocating module 114 may then trigger the remapping process and instruct the memory controller 104 to reorganize the page 108(N) by logically clustering the failed lines at an outlying portion of the page 108(N).

Accordingly, at operation 410, the clustering module 118 of the memory controller 104 creates or updates the remapping metadata 122 for the page 108(N) and clusters the failed lines at an outlying portion of the page 108(N), as discussed above with respect to FIGS. 2 and 3. For example, the clustering module 118 may determine if the failed line is a first failed line for the individual page 108(N). If the clustering module 118 determines that the failed line is the first failed line, the clustering module 118 creates remapping metadata 122 for the page 108(N) in accordance with the discussion provided above with respect to FIGS. 2 and 3. Accordingly, the clustering module 118 may create entries for each of the lines in the page 108(N), implement a "fake" failure at the top or bottom of the page 108(N) so that the remapping metadata 122 can be stored within the page 108(N), switch the entry for the failed line with the entry for a working line on the top or bottom of the page next to the remapping metadata 122, and set the indicator on the failed line to indicate that the failed line has been remapped. Thus, the clustering module 118 begins to logically cluster failed lines at an outlying portion of the page (e.g., the top or bottom depending on whether the page is an even or odd page in the memory module 106) thereby creating a larger amount of contiguous space in the page 108(N).

In various embodiments, if the clustering module 118 determines that the failed line is not the first failed line, the clustering module 118 accesses the boundary pointer 202 to determine the next available working line that separates the failed cluster of lines from the logical contiguous memory space. The clustering module 118 may then switch the entry for the subsequent (e.g., after the first failed line and the "fake" failed line) failed line with the entry for the next available working line identified by the boundary pointer 202 and set the indicator on the subsequent failed line to indicate that the failed line has been remapped.

In various embodiments, the example process 400 may be repeated each time a line within an individual page 108(N) fails. Moreover, in various embodiments, this example process 400 is performed for each of the multiple different pages 108(1) . . . 108(N) maintained in the memory module 106.

FIG. 5 illustrates an example process 500 directed to using the remapping metadata 122 during a memory read operation. For instance, the example process 500 may be associated with a read operation issued by one of the processing cores 110(1) . . . 110(M) (or a pre-fetcher) that misses the cache hierarchy and therefore is sent to the memory controller 104 to be read from the memory module 106. The memory controller 104 may be located on the memory module 106 or separate from the memory module 106 on the processing side of the system along with the system software 102.

At operation 502, the memory controller 104 attempts to read data from a line in a page 108(N). For example, the memory controller 104 may have received an issued request from one of the processing cores 110(1) . . . 110(M) to access an object or part of an object stored in the memory module 106.

At operation 504, the memory controller 104 identifies the line as a remapped line (e.g., a failed line). In at least one embodiment, the memory controller 104 may determine that the line is a remapped line by accessing, using the physical address, the actual line and examine the indicator (e.g., a single bit reserved in the error correction portion) to determine that the line is worn out and failed, and that it has been remapped.

In another embodiment, the memory controller 104 maintains the remapping metadata 122 for one or more pages 108(1) . . . 108(N) locally in the failure information cache 120 (e.g., remapping metadata 122 for pages that are currently being accessed, pages that have recently been accessed, and/or pages that are expected to be accessed in the future), and the memory controller and/or the memory allocating module 114 may check the remapping metadata 122 maintained in the failure information cache 120 to determine whether the line has been remapped and to determine the address redirection.

At operation 506, the memory controller 104 accesses the remapping metadata 122 and uses the remapping metadata 122 to determine the redirected new line that has been logically switched with the failed line and that is actually storing the data or the part of an object (e.g., lines 5 and 6 in FIG. 2).

At operation 508, the memory controller 104 reads the data from the new line.

The example process 500 of FIG. 5 may also be repeated each time a line within an individual page 108(N) is associated with a read access or read request.

In various embodiments where the remapping metadata 122 is cached at the failure information cache 120 that may be maintained at the memory controller 104, the system architecture may be able to preserve time and energy when performing a read access. For example, in order for the memory controller 104 to locate and read data from the new line when the remapping metadata 122 is not stored at the failure information cache 120, the memory controller 104 may have to access the memory module 106 in three different instances: (i) a first access that identifies that the original line has been remapped, (2) a second access to the location of the remapping metadata 122 at the top or the bottom of the page, and (3) a third access to the redirected line pointed to by the remapping metadata 122. This may increase read latency for the system. In contrast, when the remapping metadata 122 is cached at the failure information cache 120, the memory controller 104 can determine the redirection locally and then perform a single access to the memory module 106 to read the data from the new line.

The example processes illustrated in FIG. 4 and FIG. 5 may be implemented by the system software 102, the memory controller 104, or a combination of both, in conjunction with a managed runtime. Moreover, in addition to the clustering and remapping processes that reduce or eliminate fragmentation, as discussed above, the system software 102 and/or the memory controller 104 may also be configured to track the line failures in the individual pages 108(1) . . . 108(N) and maintain a failure map (e.g., in the failure information cache 120). In various embodiments, the line failures may be communicated to runtime systems so that the line failures can be avoided when allocating memory.

In some embodiments, the clustering and remapping processes discussed herein can work in conjunction with other failure handling techniques configured for memory systems. For example, the memory controller 104 may access the remapping metadata 122 for one or more pages 108(1) . . . 108(N) after failed lines within the individual pages have been remapped and clustered. Since at least some of the pages 108(1) . . . 108(N) are no longer perfect but rather imperfect because they have failed lines, the system software 102 and/or the memory controller 104 may pool or separate the pages based on whether the pages are perfect or imperfect, and the amount of contiguous space an imperfect page can provide may be communicated to a managed runtime, for example. In another example, the memory controller 104 may relocate data stored in pages 108(1) . . . 108(N) when a line fails.

In various embodiments, the remapping and clustering processes described herein may also be used in a garbage collection process that reclaims lines of memory and moves data and objects around the memory module 106. For example, a garbage collector may use a failure map obtained from the system software 102 when allocating memory. Consequently, the garbage collector may be able to avoid failed lines when allocating memory in a garbage collection process.

While the pages 108(1) . . . 108(N) in the memory module 106 discussed herein may be described as PCM, it is understood that the techniques described herein are also applicable to other types of wearable memory, and that the regions of memory and the segments of memory may vary based on the system architecture (e.g., the segments may be more or less granular compared to lines and the regions may be more or less granular compared to pages). Moreover, the memory module 106 and any other memory that may store the system software 102 and/or the memory controller 104 may also comprise computer-readable media including, at least, two types of computer-readable media, namely computer storage media and communications media.

Computer storage media includes volatile and non-volatile, removable and non-removable media implemented in any method or technology for storage of information such as computer readable instructions, data structures, program modules, or other data. Computer storage media includes, but is not limited to, random-access memory (RAM), read-only memory (ROM), electrically erasable programmable read-only memory (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other non-transmission medium that can be used to store information for access by a computing or server device.

In contrast, communication media may embody computer readable instructions, data structures, program modules, or other data in a modulated data signal, such as a carrier wave, or other transmission mechanism. As defined herein, computer storage media does not include communication media.

CONCLUSION

Although the subject matter has been described in language specific to structural features and/or methodological acts, it is to be understood that the subject matter defined in the appended claims is not necessarily limited to the specific features or operations described above. Rather, the specific features and operations described above are described as examples for implementing the claims.

What is claimed is:

1. A system comprising:
  a hardware memory module including a plurality of memory regions, individual memory regions including a plurality of segments;
  a failure detection module that detects a failed segment in a memory region of the plurality of memory regions; and
  a clustering module that logically clusters the failed segment by remapping the failed segment to a working segment located at an edge of the memory region, the working segment selected to maximize contiguous memory space within the memory region.

2. The system as recited in claim 1, wherein the clustering module further creates remapping metadata for the memory region and stores the remapping metadata for the memory region within the memory region, the remapping metadata including an entry for each of the plurality of segments in the memory region.

3. The system as recited in claim 2, wherein the clustering module stores the remapping metadata in a first segment at a top of the memory region or a last segment at a bottom of the memory region.

4. The system as recited in claim 2, wherein the clustering module switches, in the remapping metadata, a first entry associated with the failed segment with a second entry associated with the working segment.

5. The system as recited in claim 1, wherein the clustering module further creates remapping metadata for a memory remapping region that includes the memory region and an additional memory region of the plurality of memory regions and stores the remapping metadata for the memory remapping region at a top of the memory region or at a bottom of the memory region, wherein the remapping metadata includes an entry for each of the segments in the memory region and the additional memory region and the contiguous memory space spans the memory region and the additional memory region.

6. The system as recited in claim 1, wherein the working segment located at the edge of the memory region comprises at least one of a top-most available working segment of the memory region or a bottom-most available working segment of the memory region.

7. The system as recited in claim 1, wherein the hardware memory module comprises phase-change memory.

8. The system as recited in claim 1, further comprising a memory allocating module that allocates storage space in the plurality of memory regions, wherein the memory allocating module is part of an operating system.

9. The system as recited in claim 1, wherein at least one of the failure detection module or the clustering module is part of a memory controller.

10. The system as recited in claim 9, wherein the memory controller is located on the hardware memory module.

11. The system as recited in claim 1, wherein each of the plurality of memory regions comprises a page of memory and each segment comprises a line of memory.

12. The system as recited in claim 1, wherein the clustering module uses a boundary pointer to identify the working segment as a next logical working segment contiguous to a last logical failed segment clustered at the edge of the memory region.

13. The system as recited in claim 1, wherein the clustering creates a larger amount of contiguous memory space within the plurality of memory regions.

14. A method comprising:
  receiving a request to access data stored in a segment that is part of a memory region maintained in a memory module;
  identifying the segment as a failed segment that has been remapped to a working segment located at an edge of the memory region to maximize contiguous memory space within the memory region;
  accessing remapping metadata that indicates a location at the edge of the memory region for the working segment; and
  reading the data from the working segment.

15. The method as recited in claim 14, wherein:
  the remapping metadata is stored in a cache local to a memory controller;
  the identifying the segment as the failed segment includes checking the remapping metadata stored in the cache local to the memory controller; and
  the accessing the remapping metadata that indicates the location at the edge of the memory region for the working segment is performed locally at the memory controller.

16. The method as recited in claim 14, wherein the remapping metadata is stored at a top segment of the memory region or a bottom segment of the memory region.

17. The method as recited in claim 14, wherein the remapping metadata clusters failed lines at a top portion of the memory region or a bottom portion of the memory region.

18. A method comprising:
  receiving a request to write data to a segment in a memory region of a hardware memory module;
  determining that the segment is a failed segment; and
  creating remapping metadata that logically switches the failed segment with a working segment located at an edge of the memory region to create more contiguous memory space in the memory region.

19. The method as recited in claim 18, wherein the remapping metadata logically clusters one or more failed segments at a top portion of the memory region or a bottom portion of the memory region.

20. The method as recited in claim 18, wherein the remapping metadata includes a boundary pointer that identifies a next usable segment to be logically switched with a next failed segment.

* * * * *